United States Patent [19]
Perretta

[11] Patent Number: 4,542,441
[45] Date of Patent: Sep. 17, 1985

[54] CARD GUIDE

[75] Inventor: Frederick A. Perretta, Trumbull, Conn.

[73] Assignee: United Technologies Corporation, Hartford, Conn.

[21] Appl. No.: 705,395

[22] Filed: Feb. 25, 1985

Related U.S. Application Data

[63] Continuation of Ser. No. 470,366, Feb. 28, 1983, abandoned.

[51] Int. Cl.<sup>4</sup> ............................................. H05K 1/14
[52] U.S. Cl. ................................. 361/412; 339/17 LM; 339/184 M; 361/415
[58] Field of Search .............................. 361/390–392, 361/395, 399, 412, 413, 415; 339/17 M, 17 LM, 184 M, 186 M

[56] References Cited

U.S. PATENT DOCUMENTS

| | | | |
|---|---|---|---|
| 2,958,014 | 10/1960 | Blain | 361/415 |
| 3,069,598 | 12/1962 | Daily et al. | 339/17 LM |
| 3,177,461 | 4/1965 | Hagan et al. | 339/184 M |
| 3,246,279 | 4/1966 | Storcel | 339/184 M X |
| 3,818,280 | 6/1974 | Smith et al. | 361/415 X |
| 4,319,305 | 3/1982 | Meldrum | 361/415 |
| 4,377,315 | 3/1983 | Grau | 339/184 M X |

FOREIGN PATENT DOCUMENTS 975437  11/1964  United Kingdom ............... 361/515

Primary Examiner—R. R. Kucia
Attorney, Agent, or Firm—Gerald E. Linden

[57] ABSTRACT

Edge notches of various depths in circuit boards correspond with slots of various depths in a card guide so that the boards are not interchangeable.

1 Claim, 1 Drawing Figure

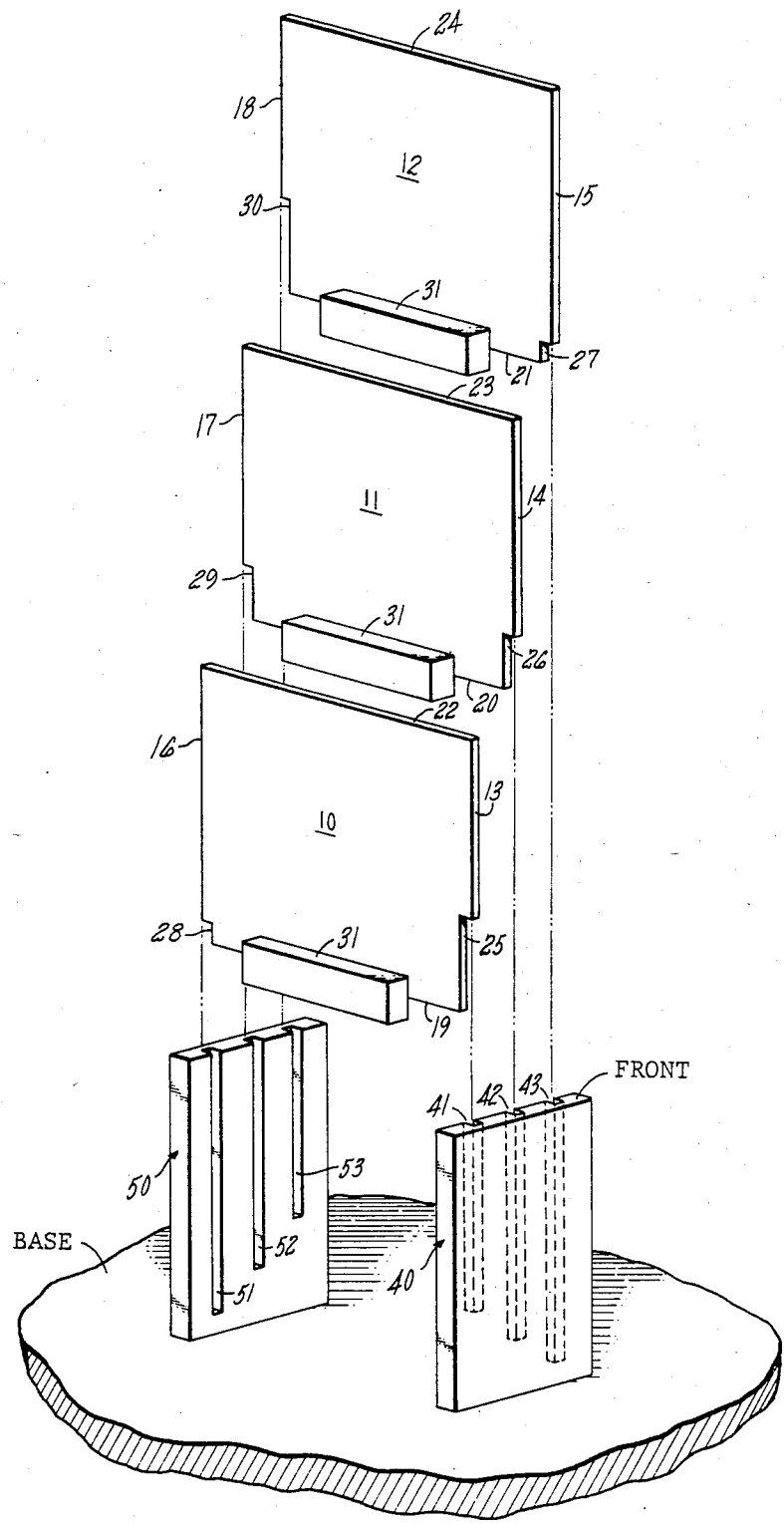

CARD GUIDE

This is a continuation of Application Ser. No. 470,366, filed Feb. 28, 1983 now abandoned.

TECHNICAL FIELD

This invention relates to circuit board guides and more particularly to guides having slots for receiving two edges of a circuit board.

BACKGROUND ART

The card guide disclosed herein is applicable to printed circuit boards, integrated circuit mother boards, and the like.

It is known to use slotted frames (card guides) to provide edge support for circuit boards. The card guide receives two edges of the circuit board and positions the circuit board. Proper positioning of a circuit board is necessary to engage a connector, such as an edge connector. A limited variety of connectors are available. Therefore, it is typical, in a slotted frame for a plurality of boards, that a board can be plugged into the wrong connector. As a solution to this problem, circuit boards are provided with keying pins which mate with holes adjacent to the connectors. Since the keying pins require increased spacing between boards, the size and weight of the assembly is increased.

DISCLOSURE OF INVENTION

Therefore, it is an object of this invention to provide for positioning and support of a plurality of circuit boards in a card guide such that a circuit board cannot be plugged into the wrong connector and such that the boards can be positioned close together. It is a further object to provide for selective board insertion using a single connector type or a limited variety of connectors, without a need for keying pins.

Accordingly, the card guide of this invention has pairs of cooperating slots, of varying depth, for receiving two edges of circuit boards. One slot of each pair is disposed on one side of the guide and the other slot of each pair is disposed on the other side of the guide. The circuit board corners are notched to correspond to a particular set of cooperating slots. In an embodiment, slot depth varies progressively in each side from shallowest to deepest, the shallowest slot in one side cooperating with the deepest slot of the other, and vice versa. When inserted into the correct slots, the trailing edges of the boards should correspond with each other. Thereby a selective insertion scheme is established, providing for complete lack of interchangeability between boards and an almost infinite number of mutually exclusive slot/notch combinations.

Other objects, features and advantages of this invention will become more apparent in the light of the following detailed description of an exemplary embodiment thereof.

BRIEF DESCRIPTION OF DRAWINGS

The sole FIGURE is an exploded perspective view of the card guide and associated circuit boards.

BEST MODE FOR CARRYING OUT THE INVENTION

In the sole FIGURE are shown three circuit boards 10–12 positioned for insertion into a card guide. The card guide has a right side 40 and a left side 50.

Each of the boards 10–12 has a right edge 13–15 and a left edge 16–18. The dimension between the right and left edges is the "board width". Each board also has a leading edge 19–21 upon which are disposed a plurality of electrical contacts, which may be a connector 31, for providing signals to, and receiving signals from a mating connector (not shown). Each board also has a trailing edge 22–24. Typically, each board also has a component "side" (i.e., face). Corner notches 25–27 are formed in the boards 10–12 between the right edge 13–15 and the leading edge 19–21. Similarly, corner notches 28–30 are formed in the boards 10–12 between the left edge 16–18 and the leading edge 19–21. The width of the boards 10–12 at the leading edges 19–21 is the "notch width". The "depth" of each corner notch 25–30 is determined as measured from the leading edges 19–21. Herein are shown three depths: "deep" (corner notches 25, 30), "medium" (corner notches 26, 29), and "shallow" (corner notches 27, 28).

Turning now to the card guide; three slots 41–43 are formed in the right side 40 and three slots 51–53 are formed in the left side 50. The sides 40, 50 are essentially parallel to each other. The sides 40, 50 are shown as solid, with slots machined therein, but they may comprise individual rails or guides mounted to a frame. The slots 41–43, 51–53 proceed to various depths from the front of the card guide, toward the base, and form a shoulder. The pair of slots 41, 51 cooperate to receive the right and left edges 13, 16 of the board 10. The pair of slots 42, 52 cooperate to receive the right and left edges 14, 17 of the board 11. The pair of slots 43, 53 cooperate to receive the right and left edges 15, 18 of the board 12.

The notch width of the boards 10–12 is less than the distance between the sides 40, 50, for clearance. The distance between slots (e.g. 41, 51) is sufficient to receive a board (e.g., 10) at its board width, but the distance between the sides 40, 50 is less than adequate to receive a board at its board width. Therefore, as a board (e.g., 10) is inserted into the card guide, it can be inserted only to that point at which a single notch (e.g., 25) contacts the bottom of a notch (e.g., 41). Preferably the depth of both notches (e.g., 25, 28) of a single board (e.g.,10) correspond to the depths of the two cooperating slots (e.g., 41, 51).

Full insertion of a board is defined as insertion of the board into the card guide along two cooperating slots until the connector 31 on the leading edge of the board engages a mating connector disposed substantially on the plane of the base. Typically, a person inserting a board into a connector will be able to discern, by feel, whether the leading edge has engaged the connector or whether corner notch contact with a shoulder (slot bottom) is preventing full insertion. Furthermore, when a plurality of similarly sized boards are inserted into the guide, failure of a particular board to engage a connector may provide a visual cue when the trailing edges of the boards do not correspond to each other. Once a board engages the associated mating connector, the guide supports and positions the board.

For full insertion, notch depth must correspond to slot depth. In other words, a "shallow" slot (e.g., 41) requires a "deep" edge notch (e.g., 25) to permit full insertion of a board (e.g., 10). For a given slot depth, a corresponding notch depth is required. A shallower notch will prevent full insertion. Of course, for a particular slot depth, a notch depth greater than the corresponding depth will also permit full insertion of a board.

Therefore, it is desirable to establish a notch/slot scheme wherein no board has both notches deeper than another board. This is facilitated by arranging the slot depths to vary progressively (ramp), on a side, from shallowest (e.g., 41) to deepest (e.g., 43). The cooperating slots of the other side are then reciprocally arranged from deepest (e.g., 51) to shallowest (e.g., 53). In other words, the shallowest slot of one side cooperates with the deepest slot of the other side, the next shallowest with the next deepest, etc. It should be understood that, once the notch/slot scheme is established, the ultimate juxtaposition of a particular slot pair facilitates identification of the proper slot pair for a particular board without additional identifying means. It should further be understood that, for more than three boards, finer gradations in depth are required to establish full exclusivity.

The reciprocal ramping scheme provides full mutual exclusivity. In other words, no board will fully insert in other than a particular slot pair. For instance, the board 10 will fully insert only in the cooperating slots 41, 51. Although the edge notch 25, being the deepest, will allow full board insertion in any of the slots 41–43, the edge notch 28, being the shallowest, will allow full board insertion only in the slot 51. The slots 52, 53 are too shallow to permit full insertion of a board with less than a corresponding notch depth. Similarly, the notch 26 of the board 11 will allow full board insertion into the slots 42, 43 while the notch 29 will allow full board insertion into the slots 51, 52. Of these four slots 42, 43, 51, 52 only two 42, 52 form a slot pair to receive a board.

It should be understood that placement of the connectors 31 on a particular face of the board or, alternatively a right/left offset of the connector 31 will prevent a board (e.g., 12) from being rotated left-for-right and fitting in the slot that corresponds to another board (e.g., 10). Selectivity may further be enhanced by establishing the notch/slot scheme such such that no two notches, except perhaps those of the "middle" card (e.g., 11), are the same. For instance, the notch 30 may be established a little deeper than the notch 25, and the notch 27 a little shallower than the notch 51.

Although shown with only three boards, the teachings disclosed herein have applicability to any number of boards. The foregoing description of the invention is intended to enable those skilled in the art to practice the invention. Although the invention has been shown with respect to an exemplary embodiment thereof, it should be understood that various changes, omissions and additions may be made therein and thereto, without departing from the spirit and the scope of the invention.

What is claimed is:

1. A ramped card guide for providing fully mutually exclusive insertion of multiple printed circuit boards into the guide, comprising:
   one side having a plurality of slots of progressively varying depth, each slot for receiving one side edge of a circuit board;
   another side having a plurality of slots of reciprocally progressively varying depth, as contrasted with the one side, each slot for receiving the other side edge of the circuit board;
   wherein each circuit board has a unique combination of edge notches of depth corresponding to the respective depths of the slots into which the board is intended to be inserted so that full insertion of all boards is indicated by trailing edge correspondence.

* * * * *

UNITED STATES PATENT AND TRADEMARK OFFICE
CERTIFICATE OF CORRECTION

PATENT NO. : 4,542,441

DATED : September 17, 1985

INVENTOR(S) : Frederick A. Perretta

It is certified that error appears in the above-identified patent and that said Letters Patent is hereby corrected as shown below:

Column 1, line 3  Please insert the following paragraph --The Government has rights in this invention pursuant to Contract No. N00019-77-C-0202 awarded by the Department of the Navy.--

Column 1, lines 4 & 5  Change "C1 TECH-NICAL FIELD" to --TECHNICAL FIELD--

Column 4, line 4  Delete "such" (second occurrence)

Signed and Sealed this

Eleventh Day of February 1986

[SEAL]

Attest:

DONALD J. QUIGG

Attesting Officer

Commissioner of Patents and Trademarks